(12) United States Patent
Jiang et al.

(10) Patent No.: US 7,772,903 B2
(45) Date of Patent: Aug. 10, 2010

(54) PULSE WIDTH MODULATION CIRCUIT CAPABLE OF LINEARLY ADJUSTING DUTY CYCLE WITH VOLTAGE AND RELATED METHOD

(75) Inventors: Shiue-Shr Jiang, Changhua County (TW); Kun-Min Chen, Changhua County (TW); Ming-Jung Tsai, Chang-Hua (TW); Ching-Sheng Li, Hsinchu County (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 12/475,615

(22) Filed: Jun. 1, 2009

(65) Prior Publication Data
US 2010/0176851 A1 Jul. 15, 2010

(30) Foreign Application Priority Data
Jan. 13, 2009 (TW) .............................. 98101035 A

(51) Int. Cl.
*H03K 3/017* (2006.01)
(52) U.S. Cl. ...................................... 327/172; 327/175
(58) Field of Classification Search ........................ None
See application file for complete search history.

(56) References Cited

U.S. PATENT DOCUMENTS

| 4,390,796 | A | 6/1983 | McClenahan | |
|---|---|---|---|---|
| 6,441,693 | B1 | 8/2002 | Lange | |
| 7,378,889 | B2 * | 5/2008 | Wu | 327/176 |
| 7,710,214 | B2 * | 5/2010 | Li | 332/109 |
| 2005/0269985 | A1 | 12/2005 | Yoshitomi | |

* cited by examiner

*Primary Examiner*—Cassandra Cox
(74) *Attorney, Agent, or Firm*—Winston Hsu

(57) ABSTRACT

A pulse width modulation circuit capable of linearly adjusting duty cycle with voltage, which comprises an input voltage source for generating an input voltage, a regulator for generating a regulated voltage, a first voltage-dividing unit for providing a first divided voltage, a second voltage-dividing unit for providing a second divided voltage, a third voltage-dividing unit for providing a third divided voltage, a voltage adder for adding the first divided voltage and the third divided voltage for generating a high level voltage, a waveform generator for generating an oscillating signal according to the high level voltage and the third divided voltage, and a comparator having a first input terminal coupled to the second voltage-dividing unit, a second terminal coupled to the waveform generator, and an output terminal for comparing the second divided voltage with the oscillating signal to output a pulse width modulation signal through the output terminal.

16 Claims, 7 Drawing Sheets

US 7,772,903 B2

PULSE WIDTH MODULATION CIRCUIT CAPABLE OF LINEARLY ADJUSTING DUTY CYCLE WITH VOLTAGE AND RELATED METHOD

BACKGROUND OF THE INVENTION

1. Field of the Invention

The present invention relates to a pulse width modulation circuit and related method, and more particularly, to a pulse width modulation circuit capable of linearly adjusting duty cycle with voltage and related method.

2. Description of the Prior Art

Pulse width modulation (PWM) technique is widely used for output power control, such as power management, motor control, audio amplifiers, etc. Please refer to FIG. 1, which illustrates a schematic diagram of a PWM circuit 10 in the prior art. The PWM circuit 10 includes a reference voltage generator 102, a triangular wave oscillator 104, and a comparator 106. The PWM circuit 10 is utilized for outputting a PWM signal $S_{PWM}$ with periodic variation of pulse width according to a result of comparing a reference voltage $V_R$ with a periodic triangular wave (or a sawtooth wave) signal $V_T$. The prior art can control the output power by changing duty cycle of the PWM signal $S_{PWM}$. Taking the U.S. patent publication document (patent publication NO. 2005/0269985) as an example, the PWM circuit 10 has a periodic triangular wave (or sawtooth wave) signal $V_T$ with fixed high and low voltage levels. As the reference voltage $V_R$ generated by the reference voltage generator 102 is linearly proportional to the input DC voltage $V_{in}$, the duty cycle of the PWM signal $S_{PWM}$ is linearly varied with the input DC voltage $V_{in}$. To make short of the matter, the duty cycle of the PWM signal $S_{PWM}$ can be linearly tunable by voltage levels of the input DC voltage $V_{in}$.

This method has some limitations and can't meet some application requirements, especially for the cases of tuning wider range of duty cycle. Modifying the design of the reference voltage generator 102 should be a solution, but it takes much more components. Another approach is to control the high and low voltage levels of the triangular wave signal $V_T$ via the input DC voltage $V_{in}$. It should be noted that the reference voltage $V_R$ is fixed for this case. In this way, the input DC voltage $V_{in}$ can adjust duty cycle of the PWM signal $S_{PWM}$ across a wider range. However, the relation between the duty cycle of the pulse width modulation signal $S_{PWM}$ and the input DC voltage $V_{in}$, as shown in FIG. 2, can not achieve absolutely linearity. This nonlinear relationship should contribute some unwanted influences. For example, when a PWM signal $S_{PWM}$ is utilized for speed control of a fan motor, it may result in a non-linear relation between the input DC voltage $V_{in}$ and the speed.

SUMMARY OF THE INVENTION

The primary objective of the present invention is to provide a pulse width modulation circuit capable of linearly adjusting duty cycle with voltage and related method.

The present invention discloses a pulse width modulation circuit capable of linearly adjusting duty cycle with voltage, which comprises an input voltage source for generating an input voltage, a regulator coupled to the input voltage source for generating a regulated voltage, a first voltage-dividing unit coupled to the regulator and a ground terminal for providing a first divided voltage, a second voltage-dividing unit coupled to the regulator and the ground terminal for providing a second divided voltage, a third voltage-dividing unit coupled to the input voltage source and the ground terminal for providing a third divided voltage, a voltage adder coupled to the a first voltage-dividing unit and the third voltage-dividing unit for adding the first divided voltage and the third divided voltage for generating a high level voltage, a waveform generator coupled to the voltage adder and the third voltage-dividing unit for generating an oscillating signal according to the high level voltage and the third divided voltage, and a comparator having a first input terminal coupled to the second voltage-dividing unit, a second terminal coupled to the waveform generator, and an output terminal for comparing the second divided voltage with the oscillating signal to output a pulse width modulation signal through the output terminal.

The present invention further discloses a method capable of linearly adjusting duty cycle with voltage for a pulse width modulation circuit, which the method comprises generating a regulated voltage according to an input voltage; transforming the regulated voltage into a first divided voltage and a second divided voltage, and transforming the input voltage into a third divided voltage; adding the first divided voltage and the third divided voltage for generating a high level voltage; generating an oscillating signal according to the high level voltage and the third divided voltage; and comparing the second divided voltage with the oscillating signal to output a pulse width modulation signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
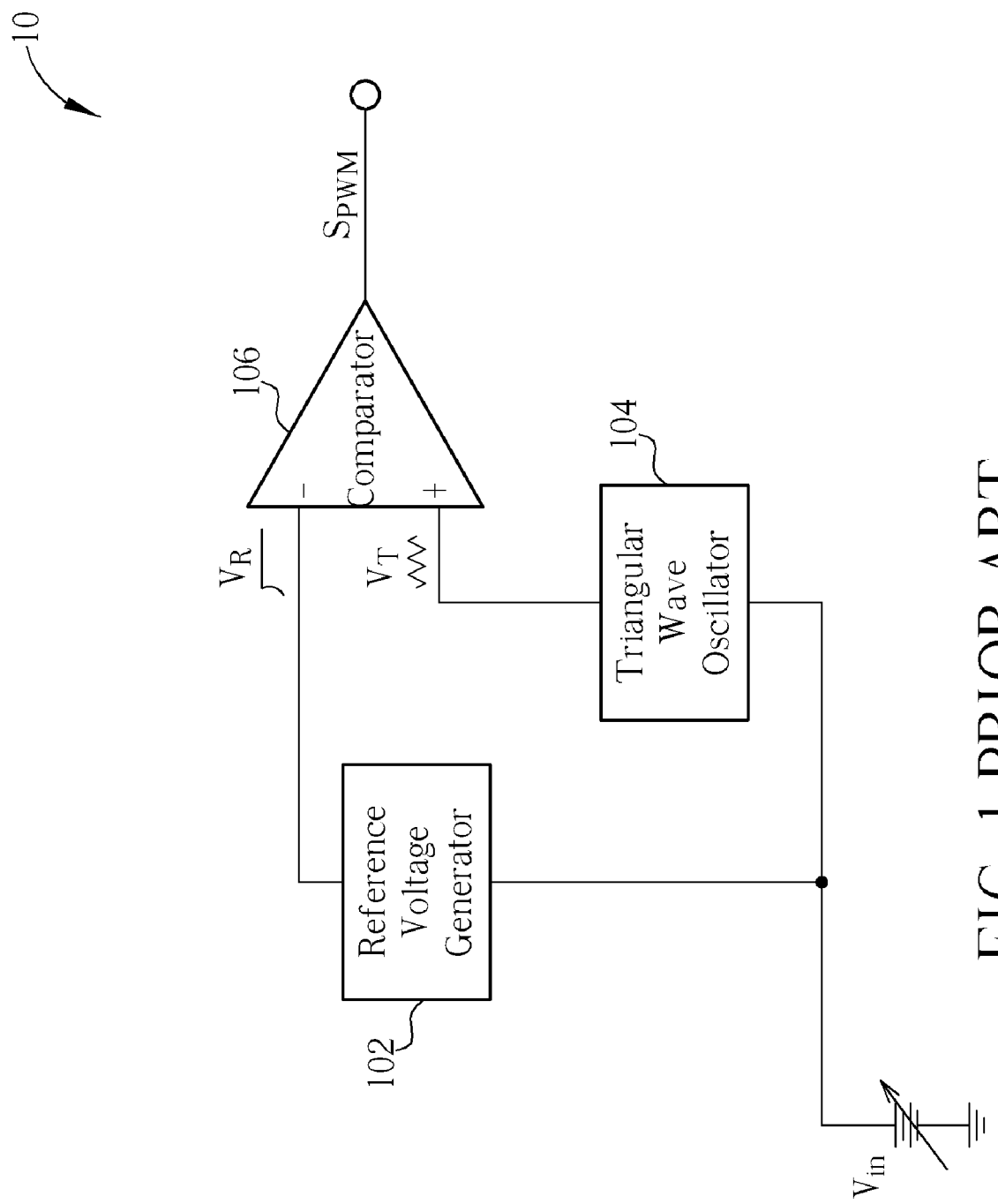
FIG. 1 is a schematic diagram of a PWM circuit in the prior art.
Figure 2:
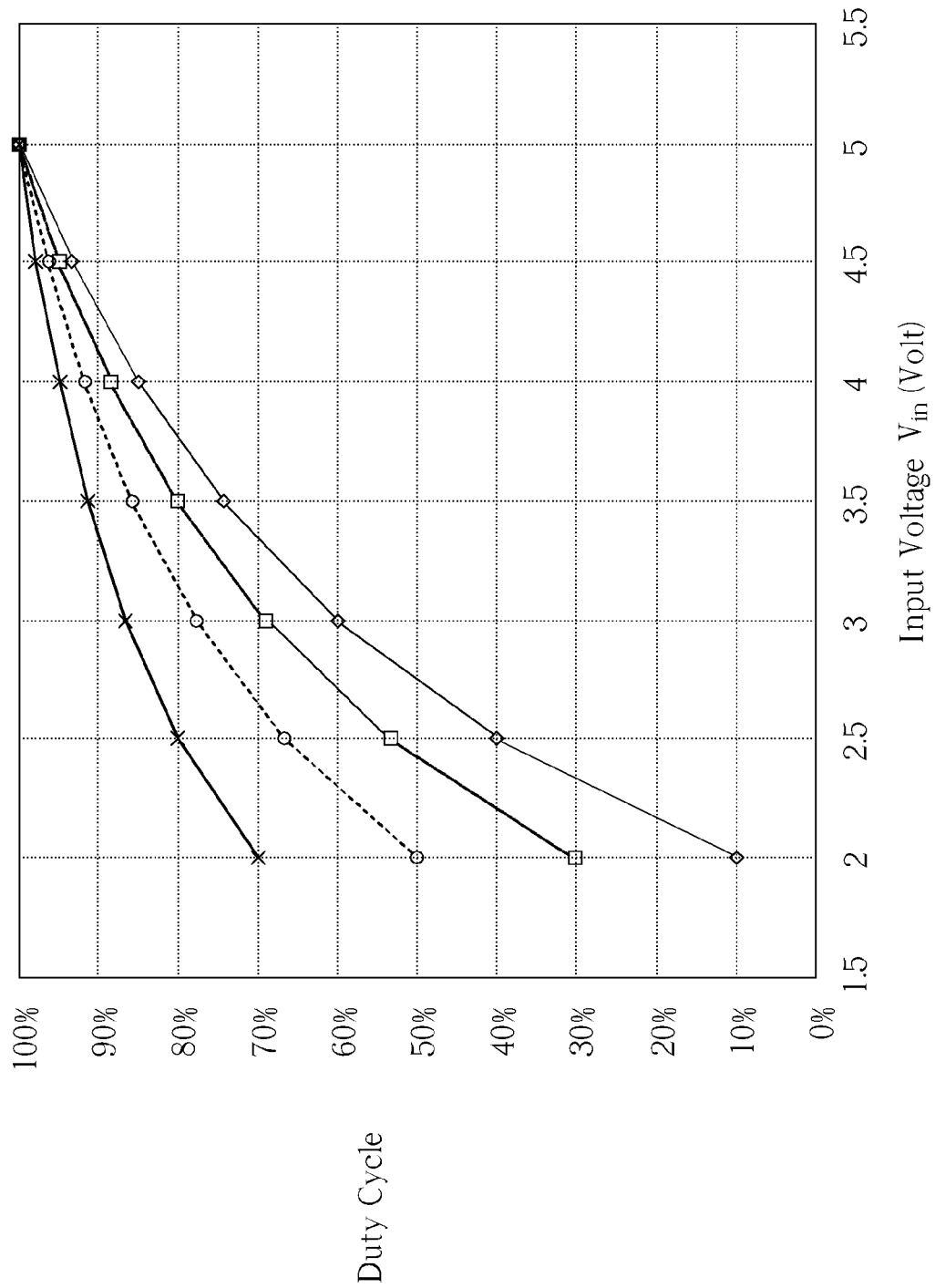
FIG. 2 is a schematic diagram showing the relationship between duty cycle of the PWM signal and input DC voltage in the modified prior art for wider tuning range of duty cycle.
Figure 3:
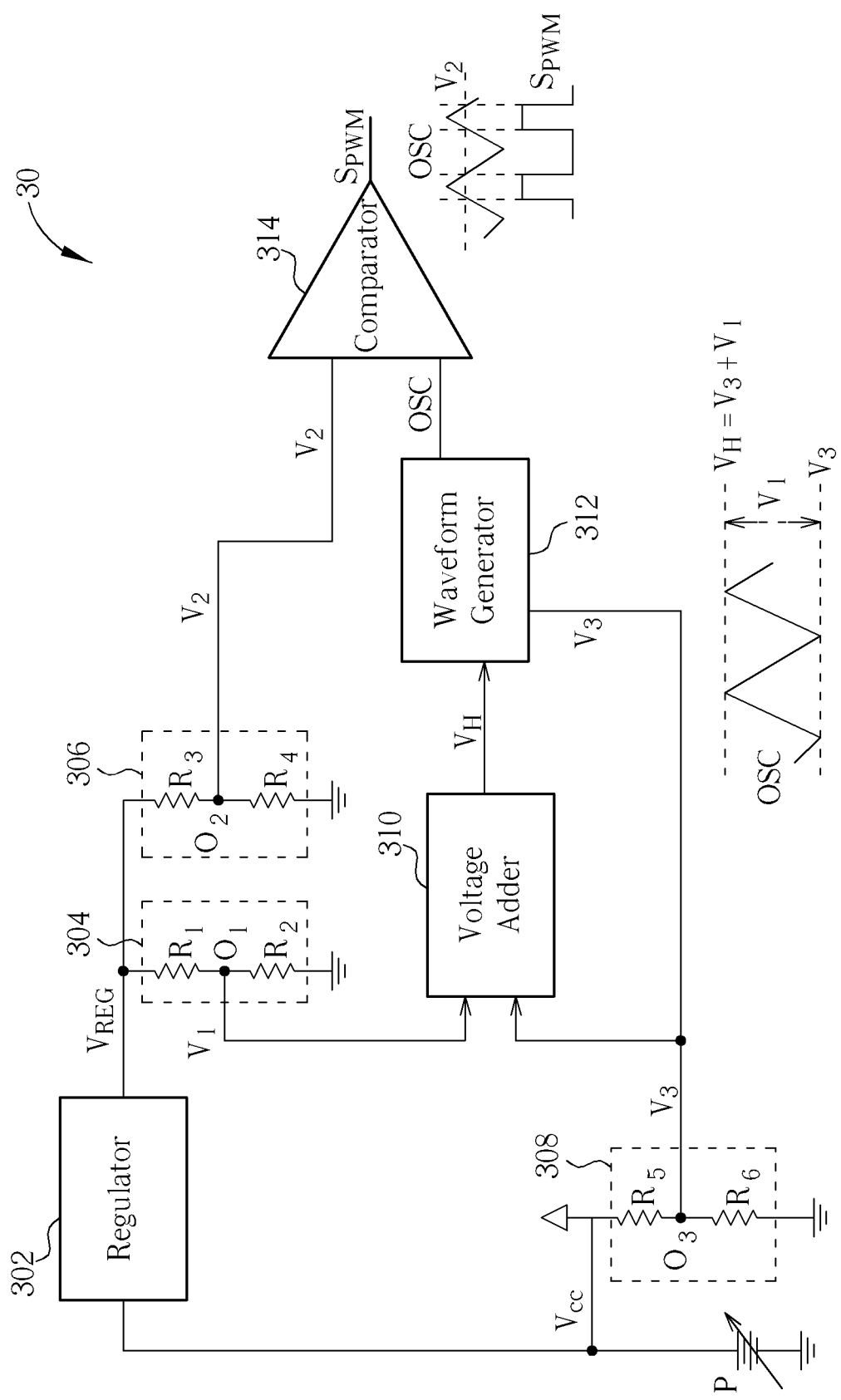
FIG. 3 is a schematic diagram of a pulse width modulation circuit according to an embodiment of the invention.

FIG. 3 is a schematic diagram of a pulse width modulation circuit 30 according to an embodiment of the invention. The pulse width modulation circuit 30 utilized for adjusting duty cycle according an input voltage includes an input voltage source P, a regulator 302, a first voltage-dividing unit 304, a second voltage-dividing unit 306, a third voltage-dividing unit 308, a voltage adder 310, a waveform generator 312, and a comparator 314. The input voltage source P is utilized for generating an input voltage $V_{CC}$. The regulator 302 is coupled to input voltage source P for generating a regulated voltage $V_{REG}$. The first voltage-dividing unit 304 is coupled to regulator 302 and a ground terminal for providing a first divided voltage $V_1$. The second voltage-dividing unit 306 is coupled to regulator 302 and the ground terminal for providing a second divided voltage $V_2$. The third voltage-dividing unit 308 is coupled to input voltage source P and the ground terminal for providing a third divided voltage $V_3$. The voltage adder 310 is coupled to first voltage-dividing unit 304 and third voltage-dividing unit 308 for adding the first divided voltage $V_1$ and the third divided voltage $V_3$ to generate a high level voltage $V_H$. The waveform generator 312 is coupled to voltage adder 310 and third voltage-dividing unit 308 for generating an oscillating signal OSC with high and low voltage levels are $V_H$ and $V_3$, respectively. The comparator 314 is coupled to second voltage-dividing unit 306 and waveform generator 312 for comparing the second divided voltage $V_2$ with the oscillating signal OSC to output a pulse width modulation signal $S_{PWM}$, so as to control driving component directly.

As illustrated in FIG. 3, the first voltage-dividing unit 304 includes a first voltage-dividing output terminal $O_1$, a first voltage-dividing resistor $R_1$, and a second voltage dividing resistor $R_2$. The first voltage-dividing output terminal $O_1$ is coupled to the voltage adder 310 and $V_1$ is the divided output voltage. The first voltage dividing resistor $R_1$ is coupled between the regulator 302 and the first voltage-dividing output terminal $O_1$. The second voltage dividing resistor $R_2$ is coupled between the first voltage-dividing output terminal $O_1$ and the ground terminal. The second voltage-dividing unit 306 includes a second voltage-dividing output terminal $O_2$, a third voltage dividing resistor $R_3$, and a fourth voltage dividing resistor $R_4$. The second voltage-dividing output terminal $O_2$ is coupled to a first input terminal of comparator 314 and $V_2$ is the divided output voltage. The third voltage-dividing resistor $R_3$ is coupled between the regulator 302 and the second voltage-dividing output terminal $O_2$. The fourth voltage-dividing resistor $R_4$ is coupled between the second voltage-dividing output terminal $O_2$ and the ground terminal. The third voltage-dividing unit 308 includes a third voltage-dividing output terminal $O_3$, a fifth voltage dividing resistor $R_5$, and a sixth voltage dividing resistor $R_6$. The third voltage-dividing output terminal $O_3$ is coupled to voltage adder 310 and waveform generator 312 and $V_3$ is the divided output voltage. The fifth voltage-dividing resistor $R_5$ is coupled between the input voltage source P and the third voltage-dividing output terminal $O_3$. The sixth voltage-dividing resistor $R_6$ is coupled between the third voltage-dividing output terminal $O_3$ and the ground terminal.

Figure 4:
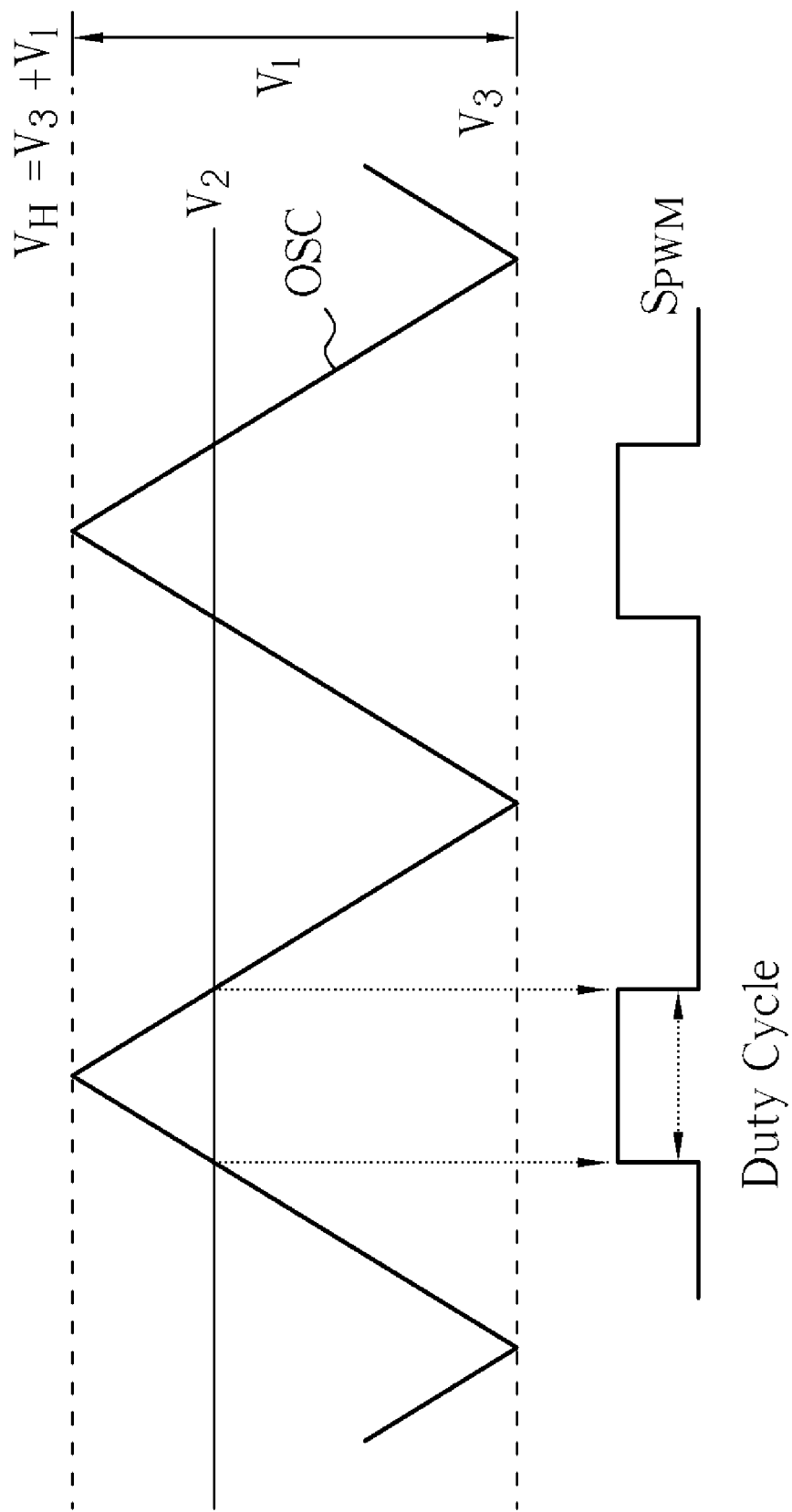
FIG. 4 is a schematic diagram of waveforms showing generation of a pulse width modulation signal according to an embodiment of the invention.

FIG. 4 is a schematic diagram of waveforms showing generation of a pulse width modulation signal $S_{PWM}$ according to an embodiment of the invention. In the pulse width modulation circuit 30, the input voltage $V_{CC}$ generated by the input voltage source P can be considered as an external control voltage source. In addition, the regulator 302 can provide and maintain a stable DC voltage level, $V_{REG}$, which should not change with variation of load current and input voltage. Note the specification for output value of a regulator should be set within a default value. The voltage adder 310 adds the first divided voltage $V_1$ and the third divided voltage $V_3$ to generate a high level voltage $V_H$ (i.e. $V_H = V_1 + V_3$). The waveform generator 312 generates an oscillating signal OSC according to high level voltage $V_H$ and the third divided voltage $V_3$. The signal OSC could be a triangular or sawtooth waveform and it's high and low voltage levels would be $V_H$ and $V_3$, respectively. The amplitude of the oscillating signal OSC is equal to the first divided voltage $V_1$. The comparator 314 compares the second divided voltage $V_2$ with the oscillating signal OSC to generate a pulse width modulation signal $S_{PWM}$. The duty cycle of the pulse width modulation signal $S_{PWM}$ can be determined as follows:

$$\text{Duty Cycle} \equiv \frac{V_H - V_2}{V_H - V_3} \quad (1)$$

The high and low levels' relationship of the oscillating signal OSC generated by the waveform generator 312 can be expressed as follows:

$$V_H = V_1 + V_3 \quad (2)$$

By substituting the equation (2) into the equation (1), the following equation is obtained:

$$\text{Duty Cycle} = \left(1 - \frac{V_2}{V_1}\right) + \left(\frac{K_a}{V_1}\right) \cdot V_{CC} \quad (3)$$

where $V_{CC}$ is the input voltage, and the $K_a$ is the ratio of voltage dividing resistors for $V_3$ $$K_a = \frac{R_5}{R_5 + R_6} \quad (4)$$

The first divided voltage $V_1$ and the second divided voltage $V_2$ are derived from the regulated voltage $V_{REG}$. The ratio of voltage-dividing resistors for $V_3$ is $K_a$. One can get that $V_1$, $V_2$, and $K_a$ are independent to the input voltage $V_{CC}$. From the equation (3), it can be appreciated that the duty cycle is linearly proportional to the input voltage $V_{CC}$. The slope of equation (3) is determined by the first divided voltage $V_1$ and $K_a$, the ratio of voltage dividing resistors. The values of this slope can be adjusted flexibly by setting the first divided voltage $V_1$ and the ratio of voltage dividing resistors $K_a$ to meet various requirements of duty cycle control. Similarly, the desired duty cycle of the pulse width modulation signal $S_{PWM}$ can also be linear adjusted by setting the second divided voltage $V_2$.

Figure 5:
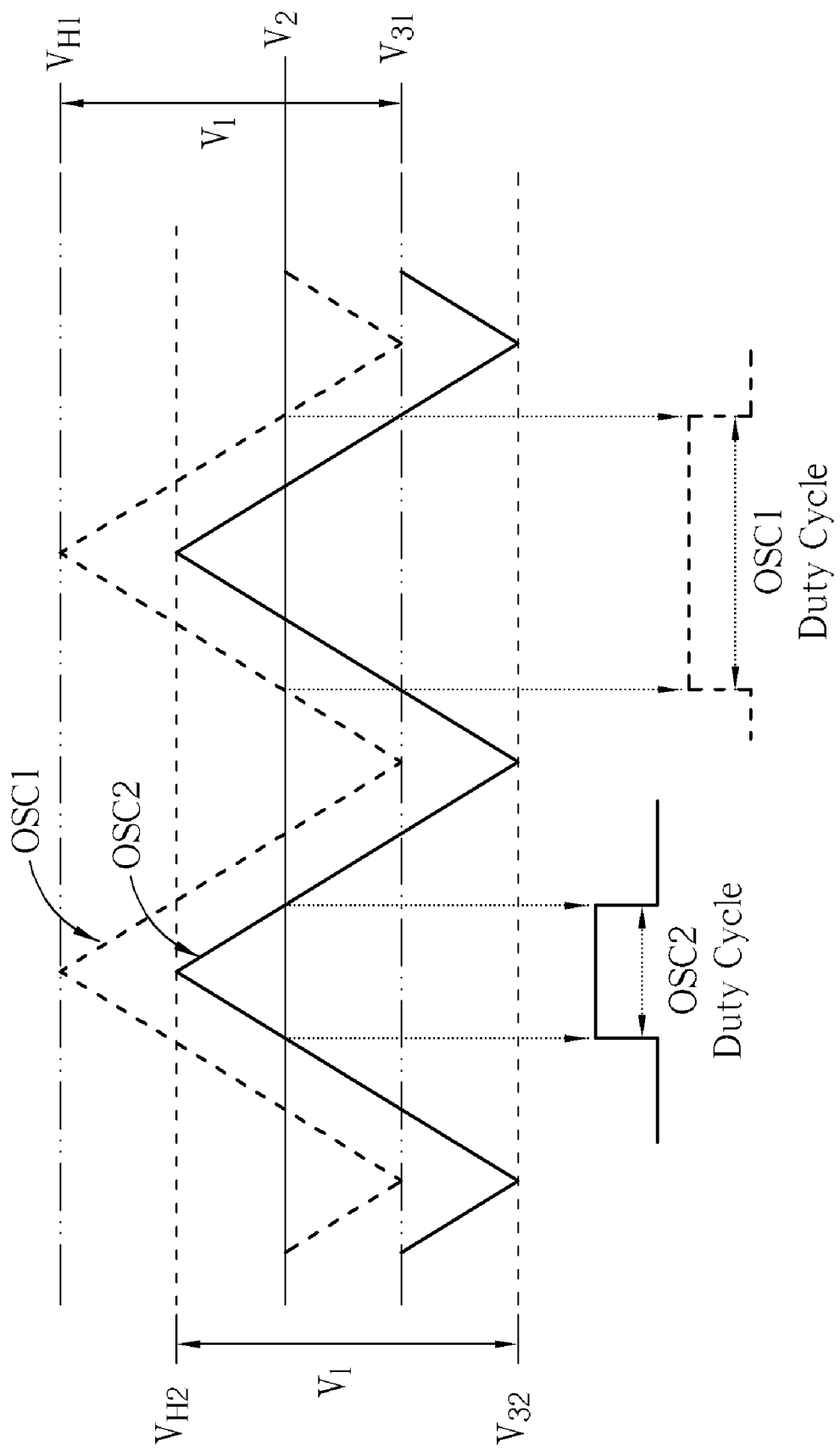
FIG. 5 is a schematic diagram showing waveforms of the pulse width modulation signal under various input voltage values according to an embodiment of the invention.

FIG. 5 illustrates the waveforms of the pulse width modulation signal under various input voltage values according to an embodiment of the invention. Suppose that two input voltage levels $V_{CC1}$ and $V_{CC2}$ are applied in the pulse width modulation circuit 30 respectively. And the voltage level of $V_{CC1}$ is higher than that of $V_{CC2}$. When the input voltage level $V_{CC1}$ is applied as the input voltage, OSC1 indicates the oscillating signal, $V_{H1}$ indicates the high level of the oscillating signal OSC1, and $V_{31}$ indicates the low level of the oscillating signal OSC1. Similarly, when the other input voltage level $V_{CC2}$ is applied as the input voltage, OSC2 indicates the oscillating signal, $V_{H2}$ indicates the high level of the oscillating signal OSC2, and $V_{32}$ indicates the low level of the oscillating signal OSC2. The pulse width modulation signals $S_{PWM1}$ and $S_{PWM2}$ corresponding to the $V_{CC1}$ and $V_{CC2}$ are outputted from the comparator 314 respectively. Please note that both conditions have the same amplitude $V_1$ for the oscillating signal and the same reference voltage $V_2$. It can be seen that the higher the input voltage level $V_{CC}$ is, the larger the duty cycle is.

Figure 6:
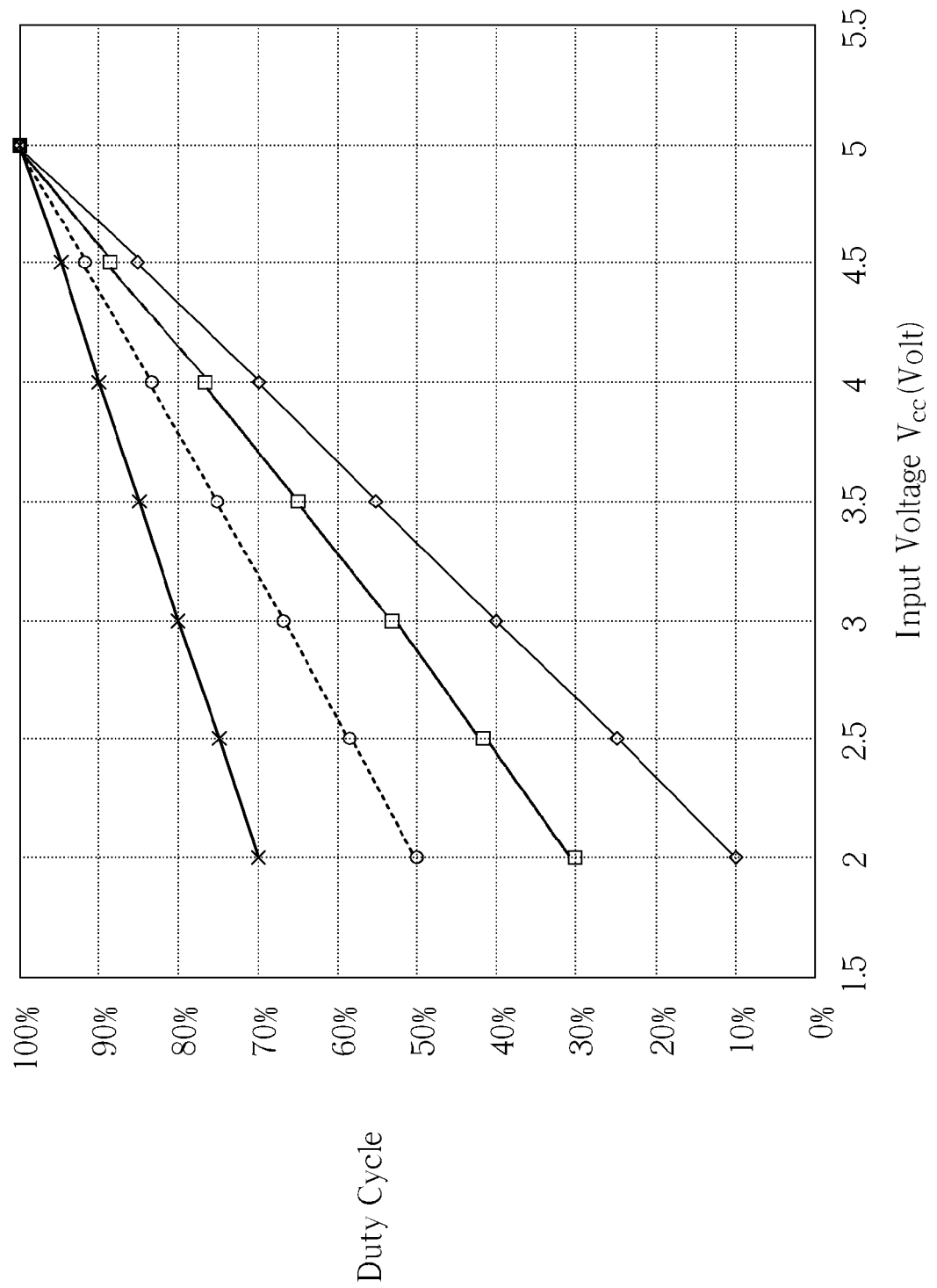
FIG. 6 is a schematic diagram showing the relationship between the duty cycle of the pulse width modulation signal and the input voltage according to an embodiment of the invention.

FIG. 6 shows the relationship between the duty cycle of the pulse width modulation signal $S_{PWM}$ and the input voltage $V_{CC}$ according to an embodiment of the invention. Under various settings of first divided voltage $V_1$ (i.e. various amplitudes), the input voltage is linearly proportional to the duty cycle. As a result, the pulse width modulation circuit 30 of the present invention is capable of improving the applications of pulse width modulation effectively. For the example of utilizing the pulse width modulation circuit 30 in speed control of a fan motor, one can linearly adjust the speed of the fan motor because of the duty cycle of the pulse width modulation signal $S_{PWM}$ linearly changed by the input voltage $V_{CC}$.

Therefore, through the pulse width modulation circuit 30 of the present invention, the duty cycle of the pulse width modulation signal $S_{PWM}$ has linear relation with the input voltage $V_{CC}$, and the voltage levels of the oscillating signal OSC can be controlled via external input voltage, so as to linearly control the duty cycle of the pulse width modulation signal $S_{PWM}$. The desired linear slope values can also be adjusted flexibly for conforming to various application requirements of the duty cycle control without additional complicated components. In other words, the present invention is capable of linearly adjusting the duty cycle of the pulse width modulation signal with input voltage and flexibility providing variations for various duty cycles.

Please note that the pulse width modulation circuit 30, shown in FIG. 3, is a schematic diagram according to an exemplary embodiment of the present invention. Those skilled in the art can make alternations and modifications accordingly. For example, first voltage-dividing unit 304, second voltage-dividing unit 306, and third voltage-dividing unit 308 can provide any desired divided voltage value by dividing the regulated voltage or input voltage with resistors or other devices. These should not be a limitation of the present invention. The waveform generator 312 can be utilized for generating all kinds of oscillating signals, such as triangular wave signals, saw tooth wave signals, ramp signals, etc. In addition, the duty cycle of the pulse width modulation signal cannot only be adjusted by setting the input voltage $V_{CC}$, but also by setting the first divided voltage $V_1$ or the second divided voltage $V_2$.

Figure 7:
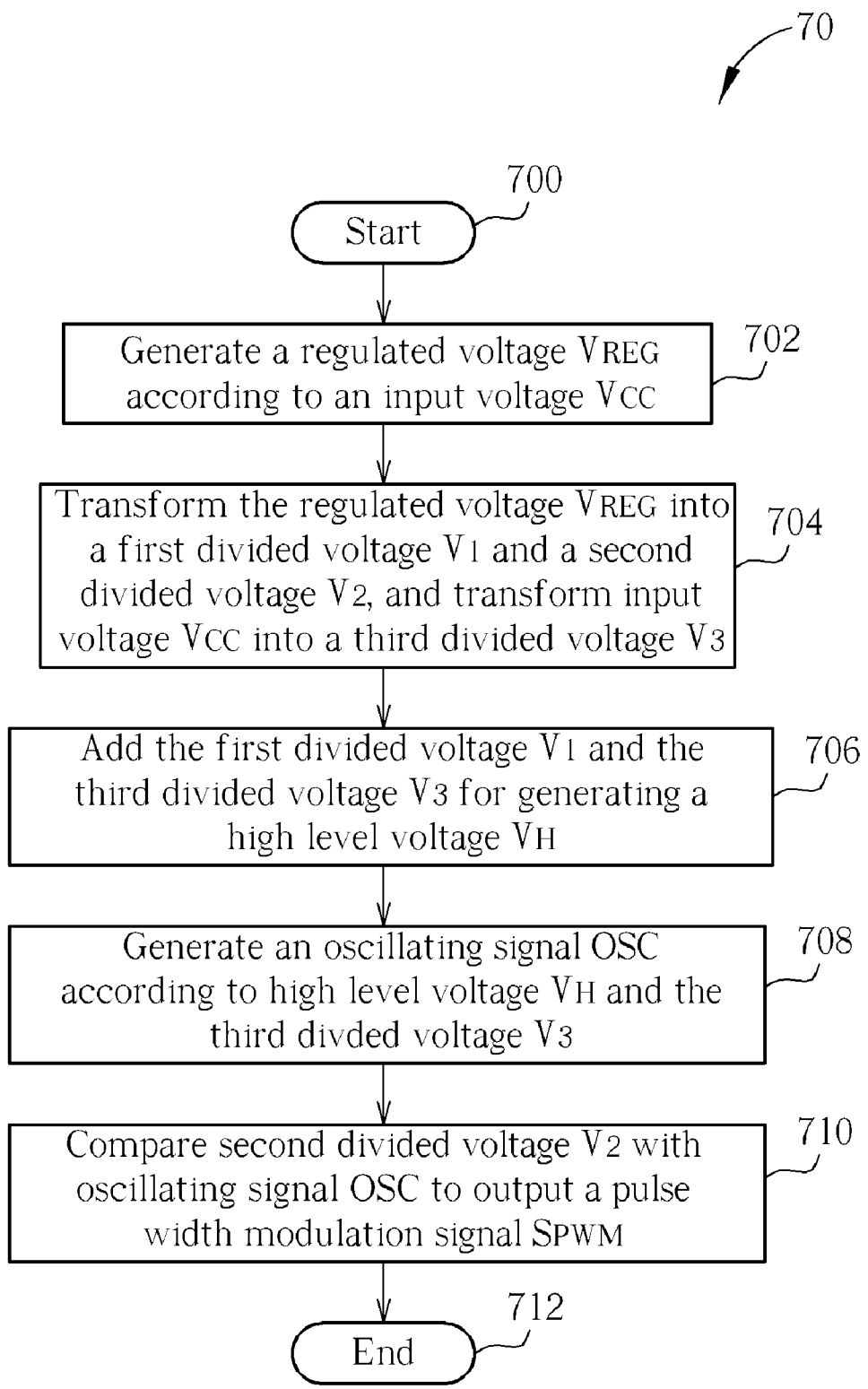
FIG. 7 is a schematic diagram of a procedure according to an embodiment of the present invention.

As to the operation of the pulse width modulation circuit 30, please refer to FIG. 7. FIG. 7 is a schematic diagram of a procedure 70 according to an embodiment of the present invention. The procedure 70 is capable of being the operating procedure for the pulse width modulation circuit 30. The procedure 70 comprises the following steps:

Step 700: Start.

Step 702: Generate a regulated voltage $V_{REG}$ according to an input voltage $V_{CC}$.

Step 704: Transform the regulated voltage $V_{REG}$ into a first divided voltage $V_1$ and a second divided voltage $V_2$, and transform input voltage $V_{CC}$ into a third divided voltage $V_3$.

Step 706: Add the first divided voltage $V_1$ and the third divided voltage $V_3$ for generating a high level voltage $V_H$.

Step 708: Generate an oscillating signal OSC according to high level voltage $V_H$ and the third divided voltage $V_3$.

Step 710: Compare second divided voltage $V_2$ with oscillating signal OSC to output a pulse width modulation signal $S_{PWM}$.

Step 712: End.

According to the procedure 70, the present invention generates the regulated voltage $V_{REG}$ according to input voltage $V_{CC}$. After that, the regulated voltage $V_{REG}$ can be transformed into a first divided voltage $V_1$ and a second divided voltage $V_2$, and the input voltage $V_{CC}$ can be transformed into a third divided voltage $V_3$. Furthermore, the voltage adder 310 adds first divided voltage $V_1$ and the third divided voltage $V_3$ to generate a high level voltage $V_H$. The waveform generator 312 is capable of generating an oscillating signal OSC according to high level voltage $V_H$ and the third divided voltage $V_3$. Finally, the comparator 314 compares second divided voltage $V_2$ with oscillating signal OSC so as to output a pulse width modulation signal $S_{PWM}$. The procedure 70 is utilized for illustrating the operation method of the pulse width modulation circuit 30. The related variations and the detailed description that referred to the foregoing illustration are omitted herein.

In summary, through the pulse width modulation circuit 30 of the present invention, the duty cycle of the pulse width modulation signal $S_{PWM}$ has linear relation with the input voltage $V_{CC}$. The voltage levels of the oscillating signal OSC can be controlled via external input voltage, $V_{CC}$, so as to linearly control the duty cycle of the pulse width modulation signal $S_{PWM}$. Furthermore, the desired linear slope values can also be adjusted flexibly for conforming to various variations of the duty cycle control requirements without additional complicated components.

Those skilled in the art will readily observe that numerous modifications and alterations of the device and method may be made while retaining the teachings of the invention.

What is claimed is:

1. A pulse width modulation circuit capable of linearly adjusting duty cycle with voltage, comprising:
    an input voltage source for generating an input voltage;
    a regulator coupled to the input voltage source for generating a regulated voltage;
    a first voltage-dividing unit coupled to the regulator and a ground terminal for providing a first divided voltage;
    a second voltage-dividing unit coupled to the regulator and the ground terminal for providing a second divided voltage;
    a third voltage-dividing unit coupled to the input voltage source and the ground terminal for providing a third divided voltage;
    a voltage adder coupled to the first voltage-dividing unit and the third voltage-dividing unit for adding the first divided voltage and the third divided voltage for generating a high level voltage;
    a waveform generator coupled to the voltage adder and the third voltage-dividing unit for generating an oscillating signal according to the high level voltage and the third divided voltage; and
    a comparator having a first input terminal coupled to the second voltage-dividing unit, a second terminal coupled to the waveform generator, and an output terminal for comparing the second divided voltage with the oscillating signal to output a pulse width modulation signal through the output terminal.

2. The pulse width modulation circuit of claim 1, wherein the first voltage-dividing unit comprises:
    a first voltage-dividing output terminal coupled to the voltage adder for outputting the first divided voltage;
    a first voltage dividing resistor coupled between the regulator and the first voltage-dividing output terminal; and
    a second voltage dividing resistor coupled between the first voltage-dividing output terminal and the ground terminal.

3. The pulse width modulation circuit of claim 1, wherein the second voltage-dividing unit comprises:
    a second voltage-dividing output terminal coupled to the first input terminal of the comparator for outputting the second divided voltage;
    a third voltage dividing resistor coupled between the regulator and the second voltage-dividing output terminal; and a fourth voltage dividing resistor coupled between the second voltage-dividing output terminal and the ground terminal.

4. The pulse width modulation circuit of claim 1, wherein the third voltage-dividing unit comprises:
   a third voltage-dividing output terminal coupled to the voltage adder and the waveform generator for outputting the third divided voltage;
   a fifth voltage dividing resistor coupled between the input voltage source and the third voltage-dividing output terminal; and
   a sixth voltage dividing resistor coupled between the third voltage-dividing output terminal and the ground terminal.

5. The pulse width modulation circuit of claim 1, wherein the oscillating signal is a triangular wave signal.

6. The pulse width modulation circuit of claim 1, wherein amplitude of the oscillating signal is a voltage difference between the high level voltage and the third divided voltage.

7. The pulse width modulation circuit of claim 6, wherein the amplitude of the oscillating signal is equal to the first divided voltage.

8. The pulse width modulation circuit of claim 1, wherein a duty cycle of the pulse width modulation signal is proportional to the input voltage.

9. A method capable of linearly adjusting duty cycle with voltage for a pulse width modulation circuit, comprising:
   generating a regulated voltage according to an input voltage;
   transforming the regulated voltage into a first divided voltage and a second divided voltage, and transforming the input voltage into a third divided voltage;
   adding the first divided voltage and the third divided voltage for generating a high level voltage;
   generating an oscillating signal according to the high level voltage and the third divided voltage; and
   comparing the second divided voltage with the oscillating signal to output a pulse width modulation signal.

10. The method of claim 9, wherein the first divided voltage is generated by dividing the regulated voltage with resistors.

11. The method of claim 9, wherein the second divided voltage is generated by dividing the regulated voltage with resistors.

12. The method of claim 9, wherein the third divided voltage is generated by dividing the input voltage with resistors.

13. The method of claim 9, wherein the oscillating signal is a triangular wave signal.

14. The method of claim 9, wherein the amplitude of the oscillating signal is the voltage difference between the high level voltage and the third divided voltage.

15. The method of claim 14, wherein amplitude of the oscillating signal is equal to a voltage level of the first divided voltage.

16. The method of claim 9, wherein a duty cycle of the pulse width modulation signal is proportional to the input voltage.

* * * * *